United States Patent
Xiao et al.

(10) Patent No.: US 12,158,307 B2
(45) Date of Patent: Dec. 3, 2024

(54) INTERNAL CIRCULATION WATER COOLING HEAT DISSIPATION DEVICE

(71) Applicant: ShenZhen Apaltek Co., Ltd., Guangdong (CN)

(72) Inventors: Qineng Xiao, Guangdong (CN); Minrui Chen, Guangdong (CN); Dagao Zheng, Guangdong (CN)

(73) Assignee: ShenZhen Apaltek Co., Ltd., Guangdong (CN)

( * ) Notice: Subject to any disclaimer, the term of this patent is extended or adjusted under 35 U.S.C. 154(b) by 448 days.

(21) Appl. No.: 17/602,167

(22) PCT Filed: Nov. 23, 2020

(86) PCT No.: PCT/CN2020/130944
§ 371 (c)(1),
(2) Date: Oct. 7, 2021

(87) PCT Pub. No.: WO2021/104217
PCT Pub. Date: Jun. 3, 2021

(65) Prior Publication Data
US 2022/0214112 A1 Jul. 7, 2022

Related U.S. Application Data

(63) Continuation-in-part of application No. 16/789,892, filed on Feb. 13, 2020, now abandoned, which is a
(Continued)

(30) Foreign Application Priority Data

Nov. 25, 2019 (CN) .......................... 201922070155.3
Nov. 20, 2020 (CN) .......................... 202022703308.6

(51) Int. Cl.
*F28D 1/053* (2006.01)
*F28F 9/02* (2006.01)

(52) U.S. Cl.
CPC ........ *F28D 1/05375* (2013.01); *F28F 9/0246* (2013.01); *F28F 2250/08* (2013.01); *F28F 2275/06* (2013.01)

(58) Field of Classification Search
None
See application file for complete search history.

(56) References Cited

U.S. PATENT DOCUMENTS 9,818,671 B2 * 11/2017 Huang ................. H01L 23/467
9,921,002 B2 *  3/2018 Suzuki ................. H01L 23/473
(Continued)

FOREIGN PATENT DOCUMENTS

CN      1964611 A          5/2007
CN    103687437 A  *  3/2014 ............ F28D 15/00
(Continued)

OTHER PUBLICATIONS

CN108566768A English Machine Translation (Year: 2018).*
(Continued)

*Primary Examiner* — Jenna M Maroney
(74) *Attorney, Agent, or Firm* — Chun-Ming Shih; HDLS IPR SERVICES

(57) ABSTRACT

A water-cooling heat dissipation device includes a water cooling head, a delivering structure, a water-cooling radiator, and a water pump. The water-cooling head includes a chamber. The delivering structure is disposed on the water-cooling head and includes a water delivery column. The water delivery column includes a first and a second water passages. The first and second water passages are connected to the chamber.
Multiple first and second slot holes are disposed on the first and second water passages respectively. The water-cooling radiator includes multiple tubes. A window is formed in the water-cooling radiator by splitting each tube. The water
(Continued)

delivery column inserts in the window. Each first and second slot holes are welded to the nozzles of the tubes.

5 Claims, 24 Drawing Sheets

Related U.S. Application Data continuation-in-part of application No. 15/541,706, filed as application No. PCT/CN2017/070823 on Jan. 11, 2017, now Pat. No. 10,609,841.

(56) References Cited

U.S. PATENT DOCUMENTS

| | | | | |
|---|---|---|---|---|
| 11,248,848 | B1* | 2/2022 | Huang | F28D 1/0341 |
| 11,624,559 | B2* | 4/2023 | Huang | F28D 7/1615 |
| | | | | 165/173 |
| 11,732,969 | B2* | 8/2023 | Chen | F28D 1/0233 |
| | | | | 165/71 |
| 2006/0067052 | A1* | 3/2006 | Llapitan | F28D 1/05375 |
| | | | | 257/E23.098 |
| 2006/0137863 | A1* | 6/2006 | Lee | G06F 1/20 |
| | | | | 361/699 |
| 2006/0185378 | A1* | 8/2006 | Duan | H05K 7/20263 |
| | | | | 62/259.2 |
| 2008/0128114 | A1* | 6/2008 | Lai | H01L 23/473 |
| | | | | 165/80.4 |
| 2009/0044929 | A1* | 2/2009 | Yeh | F28D 15/00 |
| | | | | 165/104.19 |
| 2013/0299139 | A1* | 11/2013 | Mounioloux | H01L 23/467 |
| | | | | 165/120 |
| 2017/0257979 | A1* | 9/2017 | Wu | H01L 23/473 |
| 2019/0075681 | A1* | 3/2019 | Xiao | F28D 1/05375 |
| 2019/0090384 | A1* | 3/2019 | Xiao | F28F 1/126 |
| 2021/0385969 | A1* | 12/2021 | Geng | G06F 1/20 |
| 2022/0163264 | A1* | 5/2022 | Duan | F28D 1/05375 |
| 2022/0214112 | A1* | 7/2022 | Xiao | G06F 1/206 |
| 2022/0307771 | A1* | 9/2022 | Huang | F28D 15/00 |

FOREIGN PATENT DOCUMENTS

| | | | | |
|---|---|---|---|---|
| CN | 204009742 U | | 12/2014 | |
| CN | 204392759 U | | 6/2015 | |
| CN | 105263301 A | | 1/2016 | |
| CN | 106852096 A | * | 6/2017 | H05K 7/20136 |
| CN | 108419412 A | | 8/2018 | |
| CN | 108495539 A | * | 9/2018 | F28D 1/024 |
| CN | 108566768 A | * | 9/2018 | F28D 1/024 |
| CN | 208462247 U | | 2/2019 | |
| CN | 110337227 A | * | 10/2019 | F28D 1/024 |
| CN | 211656711 U | | 10/2020 | |
| CN | 112930098 A | * | 6/2021 | F28D 1/05375 |
| CN | 113453518 A | * | 9/2021 | F28D 15/0233 |
| CN | 214708446 U | * | 11/2021 | F28D 1/05375 |
| CN | 114371768 A | * | 4/2022 | F28D 1/02 |
| CN | 116931698 A | * | 10/2023 | |
| JP | 2022086960 A | * | 6/2022 | F04D 29/426 |
| JP | 2022091657 A | * | 6/2022 | F28D 1/0316 |
| TW | 200524519 A | * | 7/2005 | F28D 15/00 |
| TW | M512730 U | * | 11/2015 | |
| WO | WO-2018152695 A1 | * | 8/2018 | |
| WO | WO-2019218380 A1 | * | 11/2019 | F28D 1/024 |

OTHER PUBLICATIONS

Search Report dated Mar. 1, 2021 of the corresponding PCT application No. PCT/CN2020/130944.
Search Report dated Feb. 28, 2017 of the corresponding PCT application No. PCT/CN2017/070823.
Office Action dated Jun. 12, 2017 of the corresponding China patent application No. 201510769643.7.

* cited by examiner

INTERNAL CIRCULATION WATER COOLING HEAT DISSIPATION DEVICE

CROSS-REFERENCE TO RELATED APPLICATIONS

This application is the National Phase of PCT International Application No. PCT/CN2020/130944 filed on Nov. 23, 2020, which claims priority to CN202022703308.6 filed on Nov. 20, 2020, which claims priority to CN201922070155.3 filed on Nov. 25, 2019, and is a continuing-in-part application of U.S. Ser. No. 16/789,892 filed Feb. 13, 2020, which is a continuation-in-part application of U.S. Ser. No. 15/541,706 filed Jul. 5, 2017, now U.S. Pat. No. 10,609,841B2, issued Mar. 31, 2020, which is National Stage Entry of PCT/CN2017/070823 filed Jan. 11, 2017, which claims priority to CN201510769643.7 filed Nov. 12, 2015. The entire disclosures of the above applications are all incorporated herein by reference.

BACKGROUND OF THE INVENTION

Technical Field

The technical field relates to a technology of heat dissipation device, and more particularly relates to an internal circulation water cooling heat dissipation device.

Description of Related Art

As the computing speed of electronic components increases continuously, the generated heat is getting higher and higher. In order to effectively solve the problem of high heat, heat pipes or vapor chambers with high conductivity and good heat dissipation efficiency are developed in the industries, and some companies are designing and researching water cooling heat dissipation devices.

A related-art water cooling heat dissipation device mainly includes a water cooling head, a water pump, a water tank, a water-cooling radiator, and a plurality of water pipes. The water cooling head, the water pump and the water-cooling radiator are all connected through water pipes and joints.

Although the related-art water cooling heat dissipation device has a high efficiency of heat dissipation, it has the following problems in use. Since each of the components of the water-cooling heat dissipation device is connected through water pipes and joints, water leakage problems easily occur at each connection position, and cause the surrounding electronic components to be damaged due to moisture. Additionally, the water-cooling heat dissipation device configured by the aforementioned components is bulky, thus the limited internal space in a computer case may be overly occupied, and the processes of installation and maintenance are complicated and difficult.

In view of the above drawbacks, the inventor proposes this disclosure based on his expert knowledge and elaborate researches in order to solve the problems of related art.

SUMMARY OF THE INVENTION

It is an object of this disclosure to provide an internal circulation water cooling heat dissipation device including a water-cooling head having a chamber, a delivering structure, a water-cooling radiator, and a water pump. The entire size of the heat dissipation device may be vastly reduced and the connections of the structure may be reduced by arranging the components appropriately. Thus, the problem of water leakage may be effectively solved.

In order to achieve the object mentioned above, this disclosure provides an internal circulation water cooling heat dissipation device including a water cooling head, a delivering structure, a water-cooling radiator, and a water pump. The water-cooling head includes a chamber. The delivering structure is disposed on the water-cooling head and includes a water delivery column. The water delivery column includes a first water passage and a second water passage communicated with the chamber respectively. A plurality of first slot holes is disposed on the first water passage, and a plurality of second slot holes are disposed on the second water passage. The water-cooling radiator includes a plurality of tubes arranged spacedly and parallelly. A window is disposed in the water-cooling radiator and each of the tubes is split by the window, and two nozzles are formed on each of the tubes being split. The water delivery column inserts in the window. Each of the first slot holes is welded to one nozzle of each of the tubes, and each of the second slot holes is welded to the other nozzle of each of the tubes. A water pump is installed in the water delivery column or on one side of the water-cooling radiator.

Comparing to the related art, this disclosure provides an internal circulation water cooling heat dissipation device including a water-cooling head having a chamber, a delivering structure, a water-cooling radiator, and a water pump. The entire size of the heat dissipation device may be vastly reduced and the connections of the structure may be reduced by arranging the components appropriately. Thus, the problem of water leakage may be effectively solved.

BRIEF DESCRIPTION OF DRAWINGS

The features of the disclosure believed to be novel are set forth with particularity in the appended claims. The disclosure itself, however, may be best understood by reference to the following detailed description of the disclosure, which describes a number of exemplary embodiments of the disclosure, taken in conjunction with the accompanying drawings, in which:

DETAILED DESCRIPTION OF THE EMBODIMENTS

In cooperation with attached drawings, the technical contents and detailed description of the disclosure are described thereinafter according to a number of embodiments, being not used to limit its executing scope. Any equivalent variation and modification made according to appended claims is all covered by the claims claimed by this disclosure.

Please refer to FIG. 1 to FIG. 6, this disclosure provides an internal circulation water cooling heat dissipation device. Here refers "internal circulation" to the structure that the working fluids, such as water, being communicated without using joints or long-distance connecting elements such as hoses. The internal circulation water cooling heat dissipation device includes a water cooling head 10, a delivering structure 20, a water-cooling radiator 30 and a water pump 22.

Figure 2:
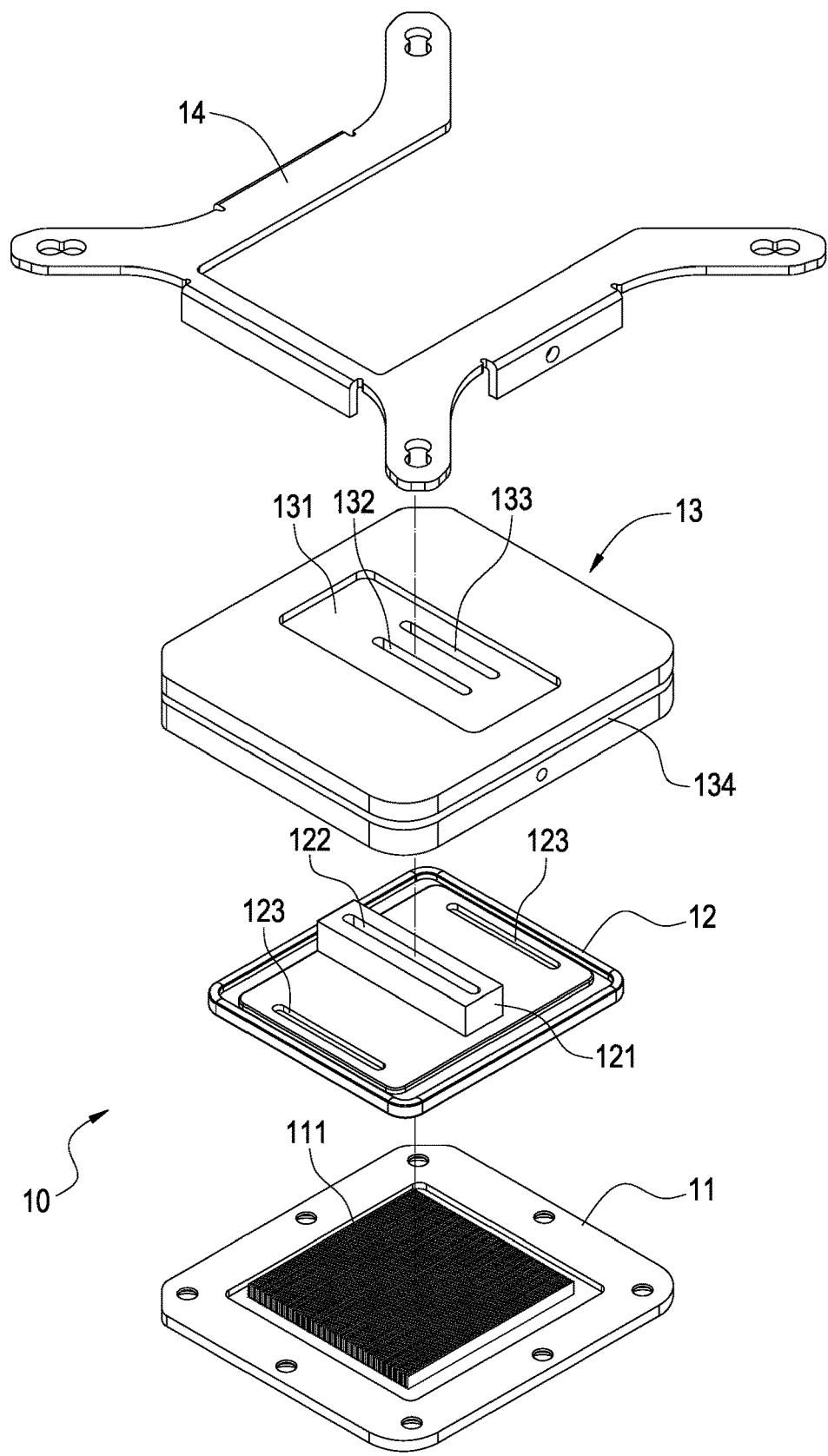
FIG. 2 is a perspective exploded schematic view of the water cooling head and the fixing frame of this disclosure.

Please refer to FIG. 2, the water cooling head 10 includes a chamber, a lower shell 11, a middle plate 12 and an upper shell 13. The lower shell 11 is made of the materials with preferable thermal conductivity such as copper, aluminum, or alloys thereof. The lower shell 11 is substantially, but not limited to, in a rectangular shape. The bottom of the lower shell 11 may attach to a heat source (not shown in figures), and a plurality of heat dissipation fins 111 are arranged inside the lower shell 11.

The middle plate 12 is disposed above the heat dissipation fins 111 and covers the upper shell 11 correspondingly. A separating post 121 is disposed on and extended from the center of the middle plate 12. A water inlet groove 122 is disposed on the separating post 121, and a water outlet groove 123 is disposed respectively on two sides of the middle plate 12.

The upper shell 13 covers the lower shell 11, and the middle plate 12 is clamped between the lower shell 11 and the upper shell 13. The chamber is formed between the lower shell 11 and the upper shell 13. In addition, a recessed area 131 is disposed on the middle position of the upper shell 13, and a water inlet 132 and a water outlet 133 are disposed in the recessed area 131. It should be noted that each of the water outlet grooves 123 is communicated with the water inlet 132 and the water inlet groove 122 through the interval between the lower shell 11 and the middle plate 12.

The bottom of the recessed area 131 attaches flatly to the top edge of the separating post 121 of the middle plate 12 (referring to FIG. 8), and the water inlet 132 is aligned with the water inlet groove 122. In addition, the outer periphery of the upper shell 13 is provided with an embedding groove 134 for inserting a fixing frame 14, and the fixing frame 14 inserts in the embedding groove 134 to connect with the upper shell 13.

Figure 1:
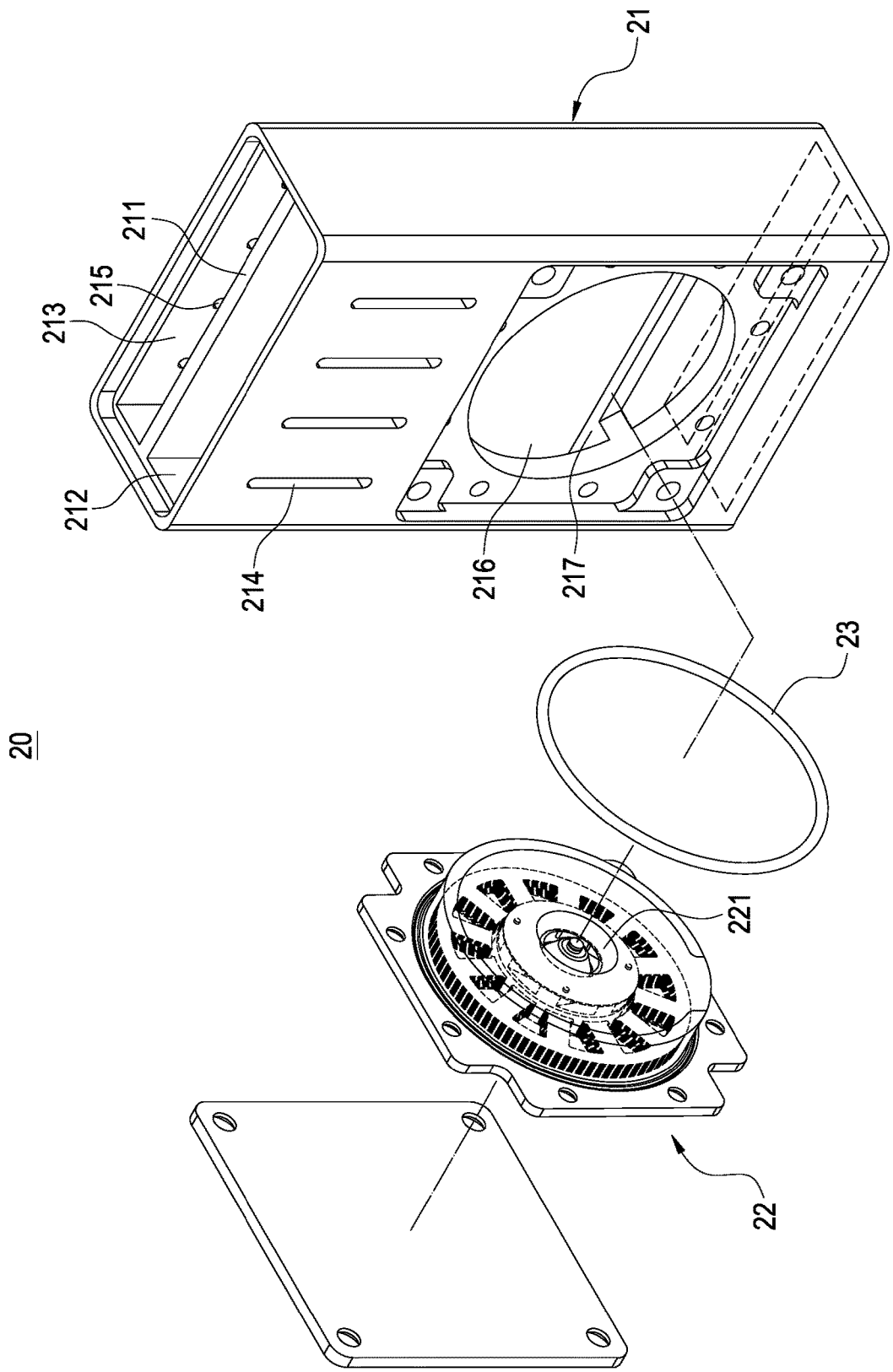
FIG. 1 is a perspective exploded schematic view of the delivering structure of this disclosure.
Figure 3:
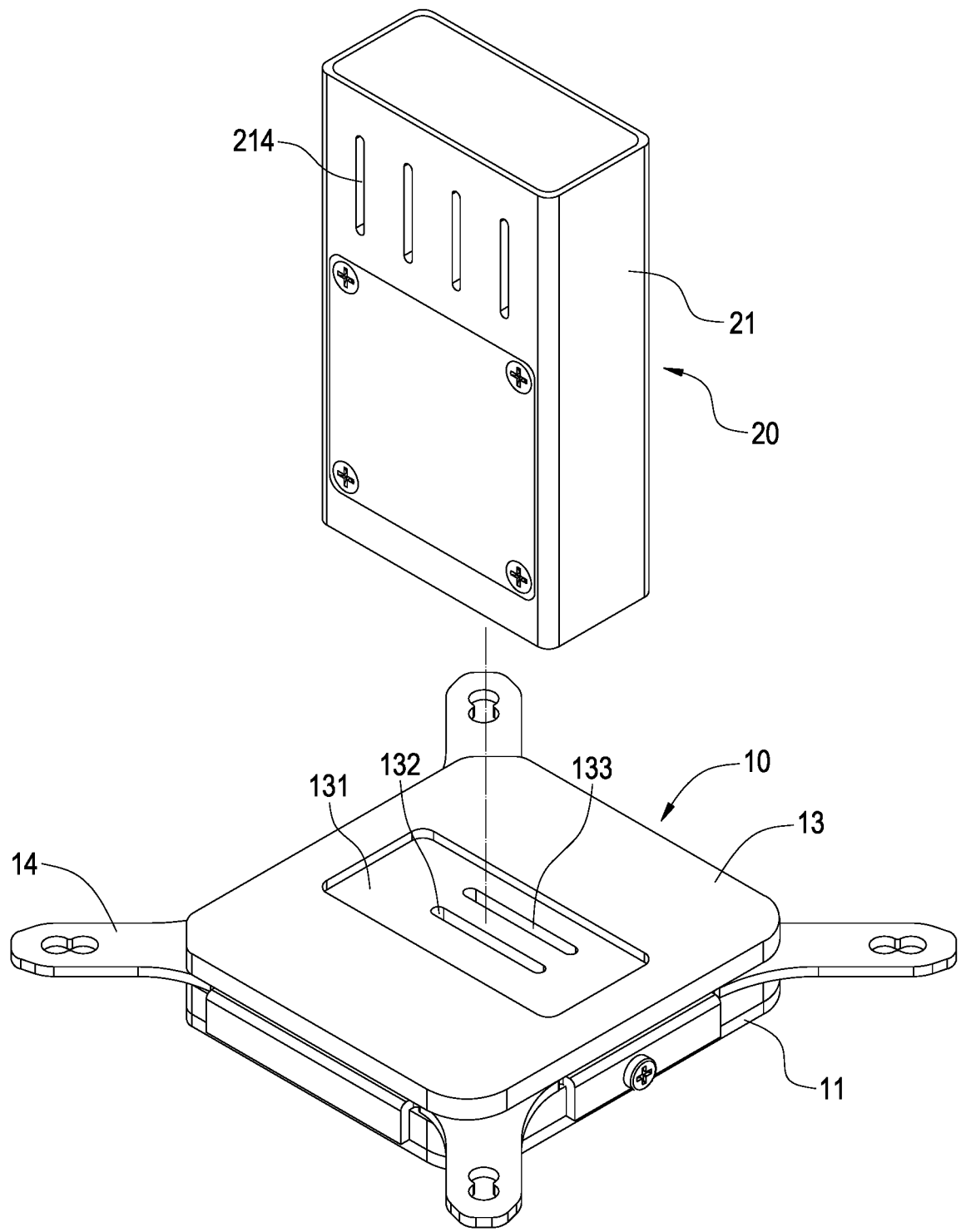
FIG. 3 is a perspective exploded view of the water cooling head and the delivering structure of this disclosure.
Figure 4:
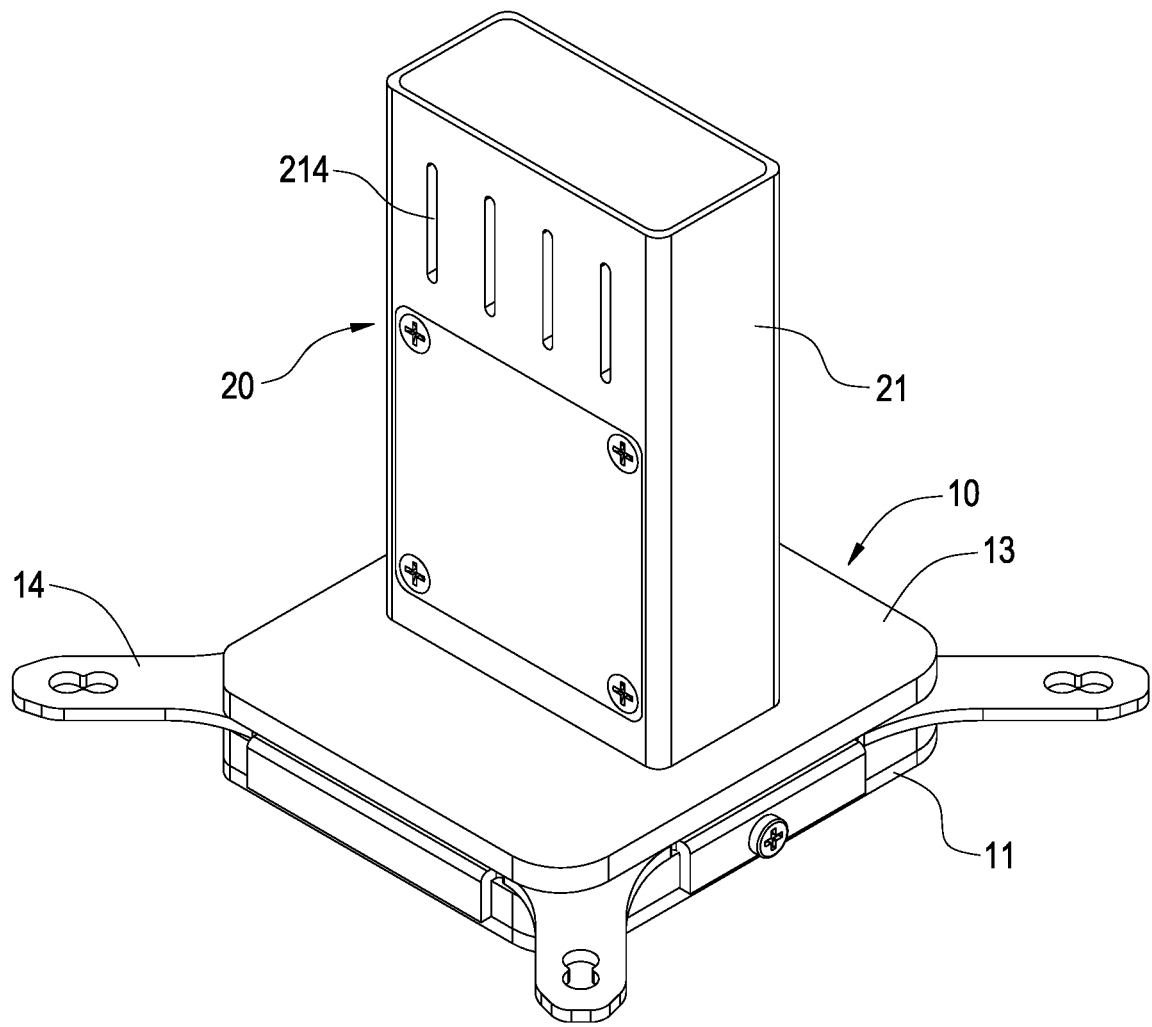
FIG. 4 is a schematic view of combination of the water cooling head and the delivering structure of this disclosure.
Figure 5:
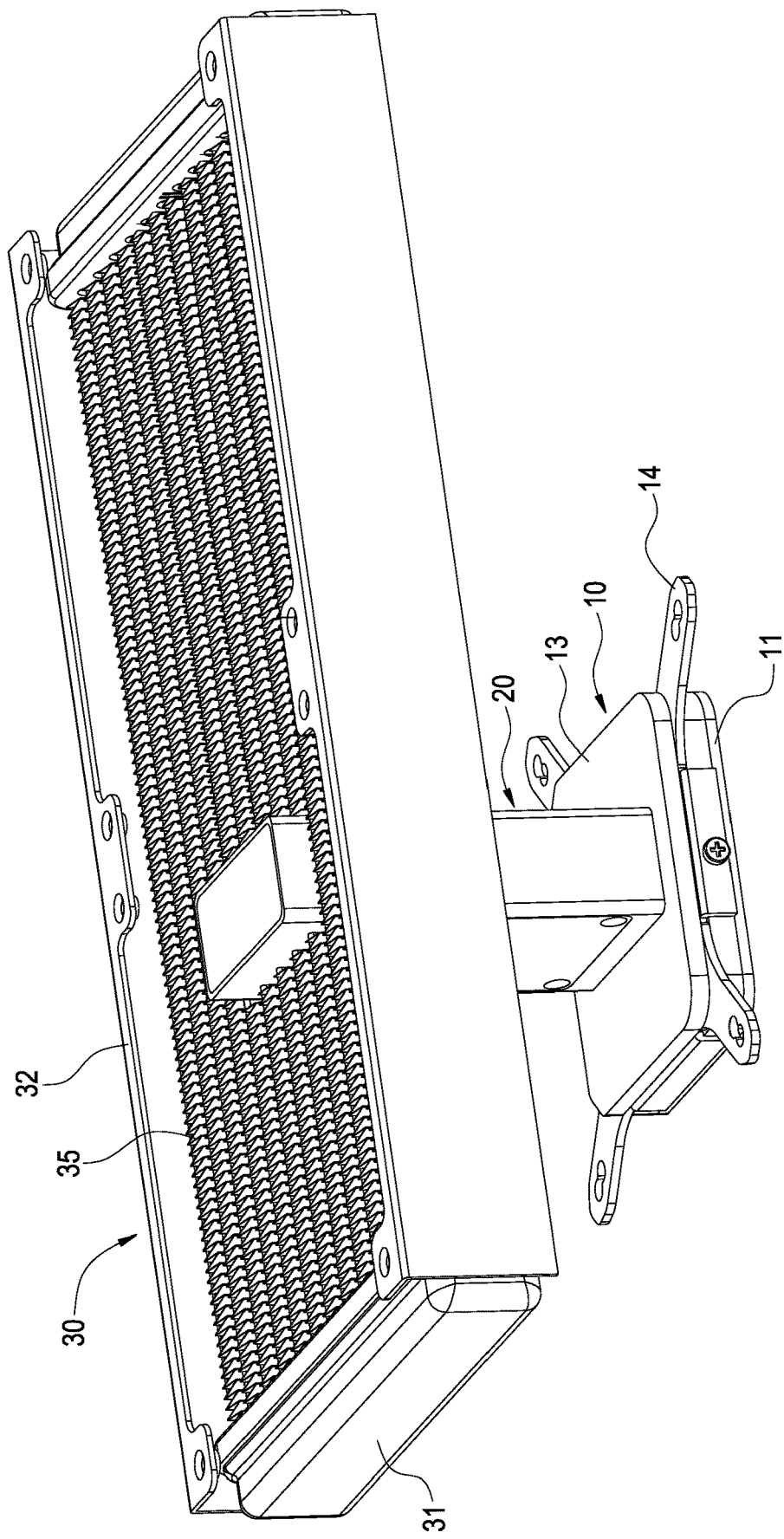
FIG. 5 is a schematic view of the assembly of the internal circulation water cooling heat dissipation device of this disclosure.
Figure 6:
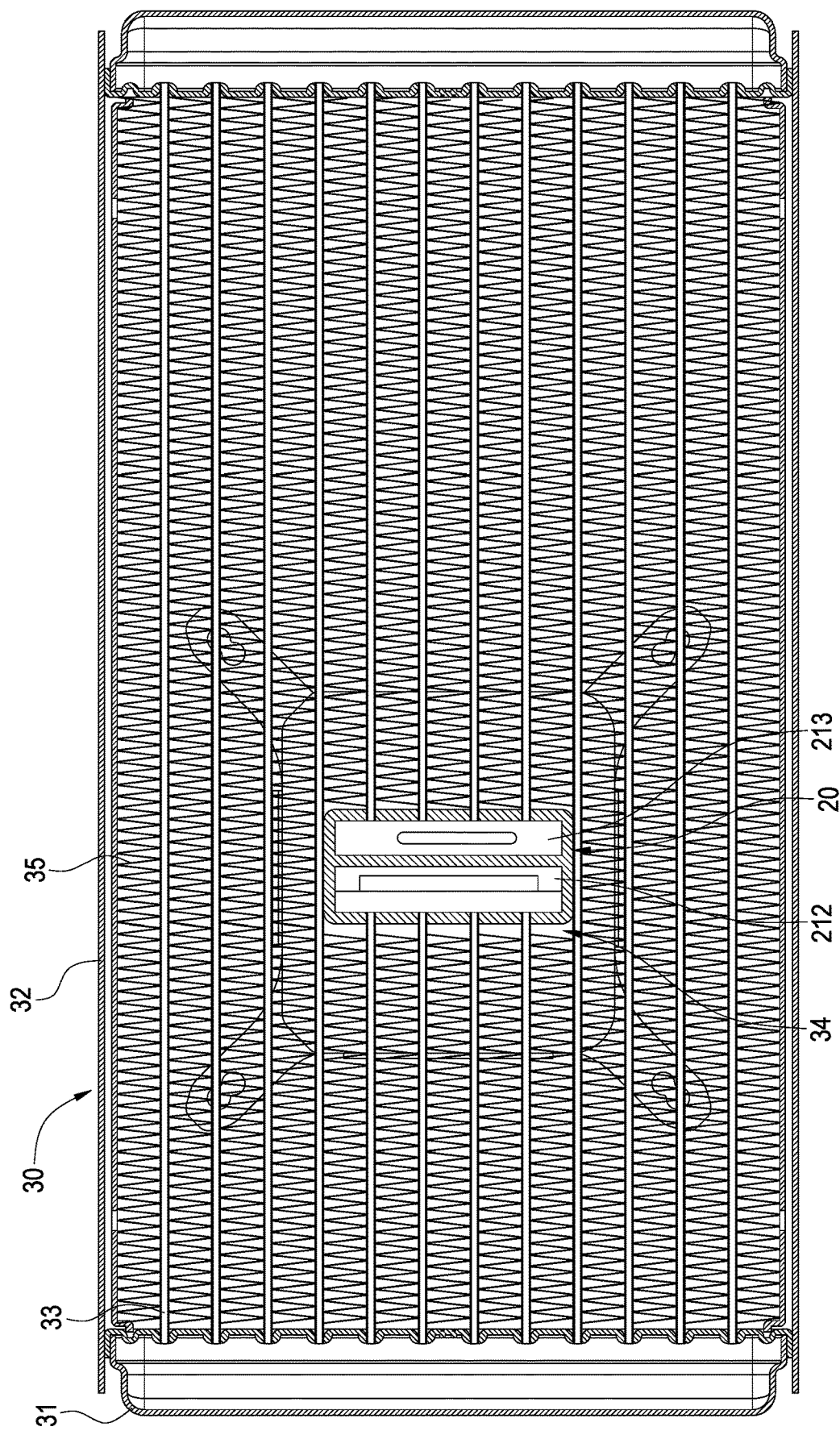
FIG. 6 is a cross sectional view of combination of the delivering structure and the water-cooling radiator of this disclosure.

Please refer to FIG. 1, FIG. 3, and FIG. 4, the delivering structure 20 is disposed on the recessed area 131 of the water cooling head 10. The delivering structure 20 includes a water delivery column 21, and the water delivery column 21 erects on the upper shell 13 through the recessed area 131. The water delivery column 21 is substantially, but not limited to, a rectangular tube.

The water delivery column 21 includes a first water passage 212 and a second water passage 213. The first water passage 212 is communicated with the chamber through the water inlet 132 and the water inlet groove 122. Furthermore, the second water passage 213 is communicated with the chamber through the water outlet 133. Additionally, a plurality of first slot holes 214 are disposed on a side of the first water passage 212 of the water delivery column 21, and a plurality of second slot holes 215 are disposed on a side of the second water passage 213 (referring to FIG. 8).

In this embodiment, the first water passage 212 and the second water passage 213 are configured by a water delivery column 21 in one-piece form. Moreover, an interior of the water delivery column 21 is separated into the first water passage 212 and the second water passage 213 by a partition 211. Please refer to FIG. 5 and FIG. 6, the water-cooling radiator 30 includes a pair of water storage chambers 31, a pair of frame plates 32 and a plurality of tubes 33 arranged spacedly and parallelly. Each of the water storage chambers 31 is connected to the front end and the rear end of each tube 33, and the interiors of the water storage chambers 31 are communicated with each other. Each of the frame plates 32 is connected to two sides of each of the water storage chambers 31 respectively and encloses the tubes 33 therein.

Specifically, a window 34 is formed and disposed in the water-cooling radiator 30 and each of the tubes 33 is split by the window 34 Two nozzles are formed on each of tubes 33 that is split by the window 34. The water delivery column 21 inserts in the window 34. Each of the first slot holes 214 is welded to one nozzle of each of the tubes 33, and each of the second slot holes 215 is welded to the other nozzle of each of the tubes 33. Furthermore, a plurality of wave-shaped heat dissipation fins 35 are arranged between any two adjacent tubes 33.

Moreover, the water pump 22 is installed on one side of the water delivery column 21 or one side of the water-cooling radiator 30.

In more detail, in this embodiment, a mounting hole 216 is disposed on one side of the first water passage 212 of the water delivery column 21, and the water pump 22 is installed on one side of the first water passage 212 corresponding to the mounting hole 216. Additionally, the water delivery column 21 is disposed corresponding to the mounting hole 216 and provided with a water blocking strip 217 inside the first water passage 212.

Figure 9:
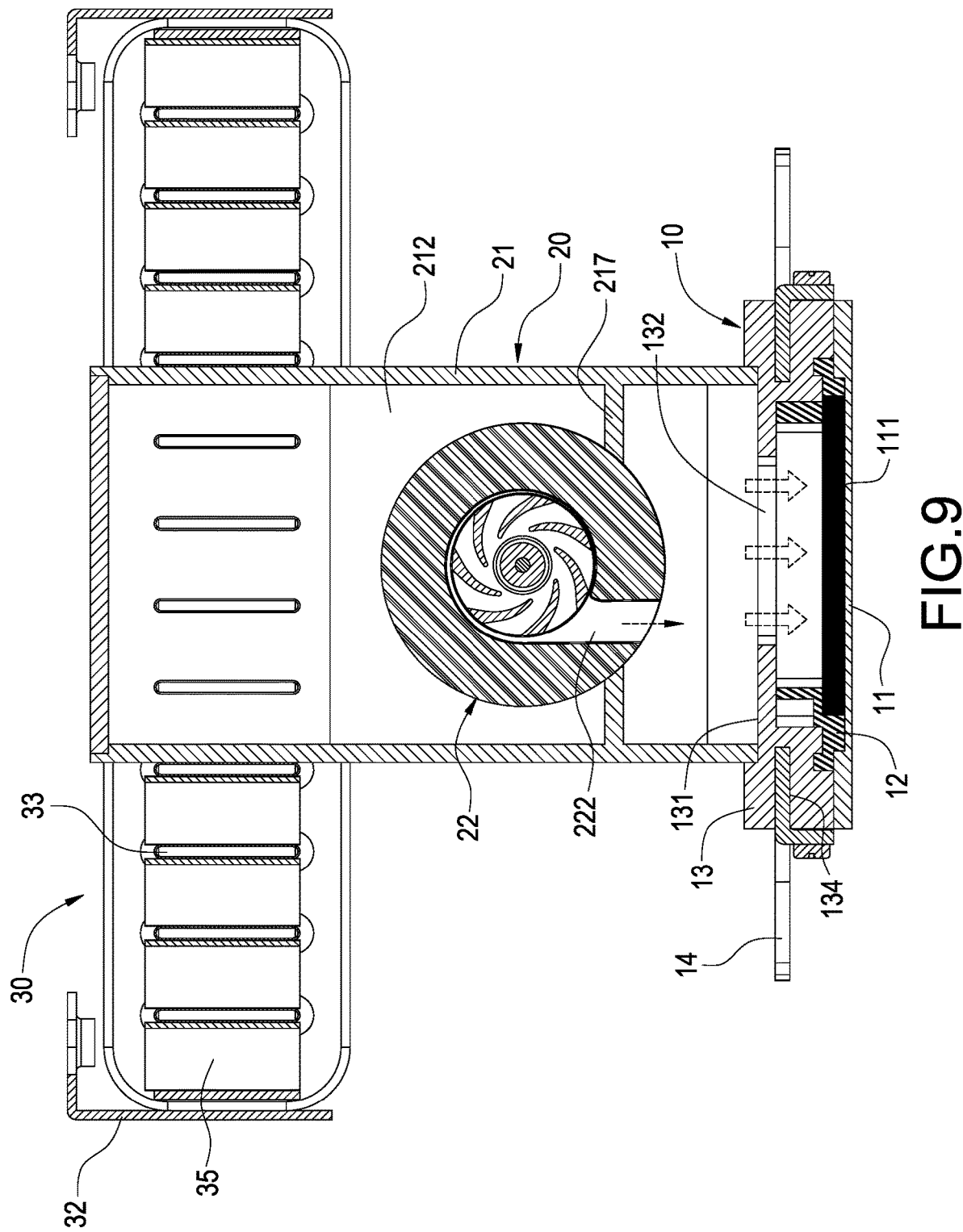
FIG. 9 is a cross sectional view of the assembly of the internal circulation water cooling heat dissipation device of this disclosure.

Further, the axis line of the water pump 22 is arranged parallel to each tube 33, and the water pump 22 includes a central hole 221 and a lateral hole 222 (referring to FIG. 9). Moreover, the water pump 22 includes a rotor, a stator, and an impeller, etc. The water pump 22 is hermetically sealed and connected in the water delivery column 21 through a gasket 23. In this embodiment, the water pump 22 is a centrifugal water pump, and the inlet direction is orthogonal to the outlet direction, but it is not limited thereto. Specifically, here uses twelve tubes 33 as an example, but the number is not limited thereto. In addition, the window 34 is disposed in the middle section of the four tubes 33 in the middle area of the water-cooling radiator 30, so that the number of water outlet pipes is greater than the number of water inlet pipes to improve heat exchange efficiency.

Figure 7:
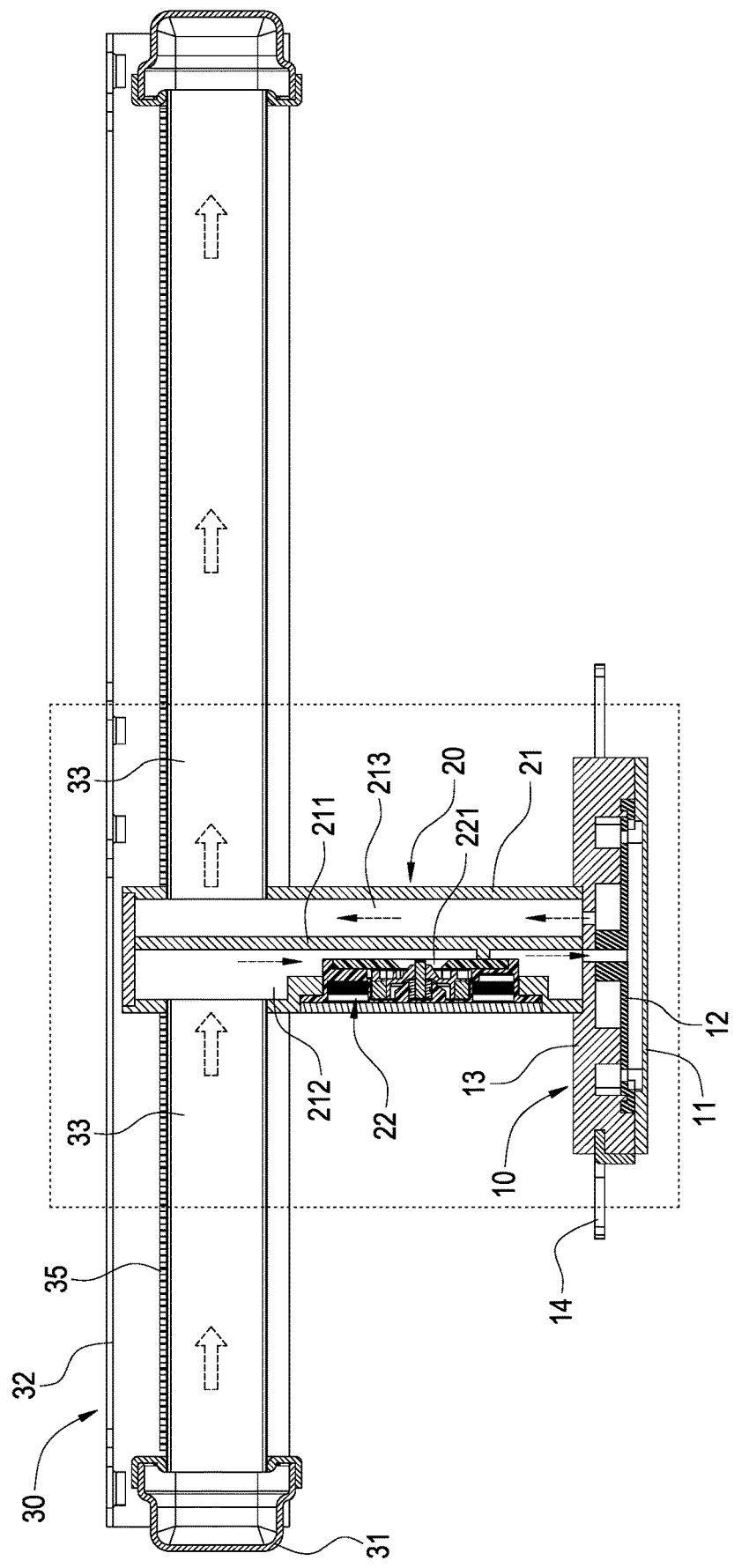
FIG. 7 is a cross sectional view of the assembly of the internal circulation water cooling heat dissipation device of this disclosure.
Figure 8:
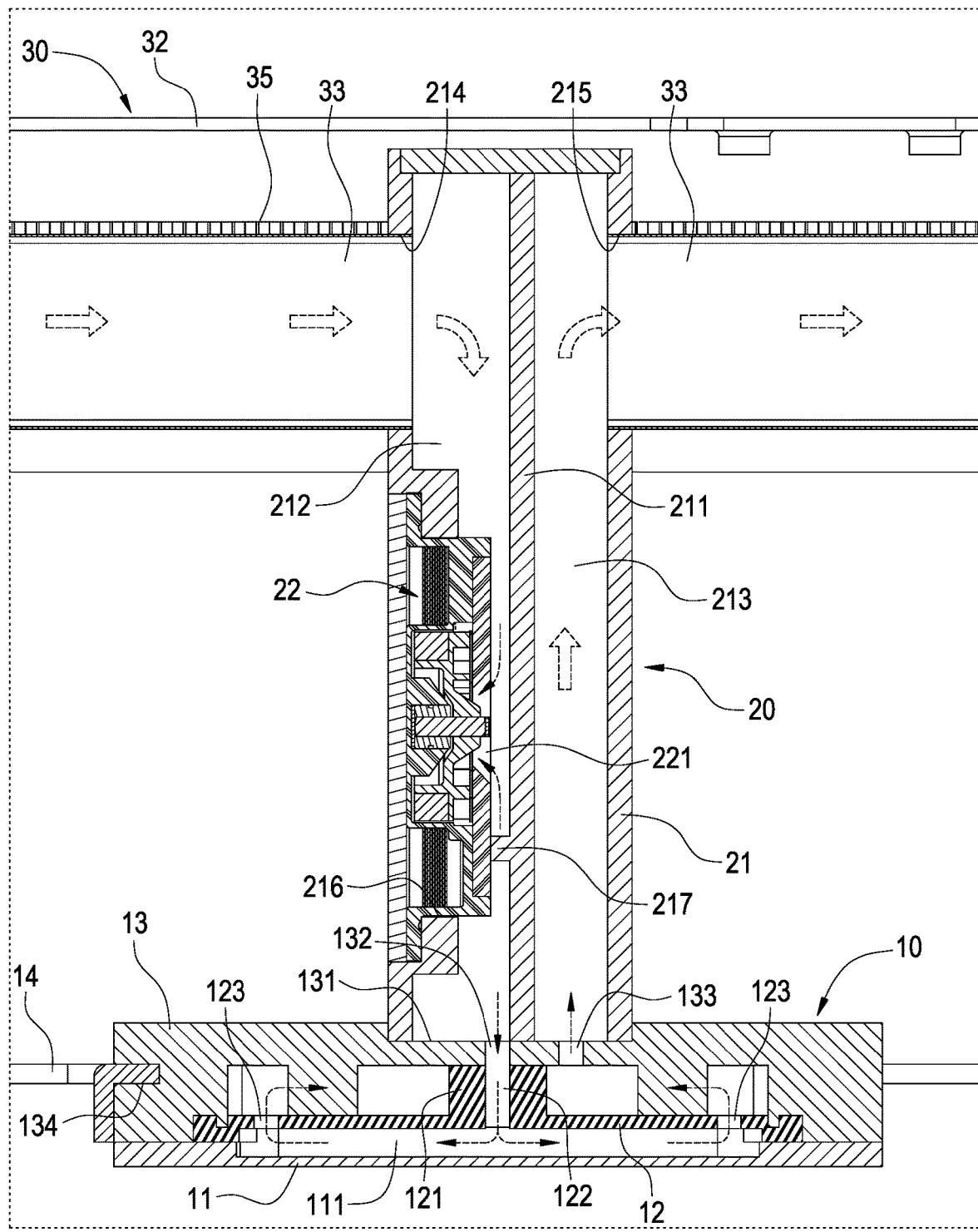
FIG. 8 is a top view of FIG. 7 of this disclosure.

Please further refer to FIG. 7 to FIG. 9, the water-cooling heat dissipation device of this disclosure is constituted by a combination of the above components. When the water-cooling heat dissipation device is in use, the water flows from the first water passage 212 into the central hole 221 of the water pump 22 through the operation of the water pump 22. The water further flows out from the lateral hole 222 of the water pump 22 after being pushed and transmitted by the impeller. Then, the water flows from the water inlet 132 through the water inlet groove 122 to enter the chamber for exchanging heat with each heat dissipation fin 111. Moreover, the heat-exchanged water flows to the upper portion of the middle plate 12 from each water outlet groove 123 and flows to the second water passage 213 through the water outlet 133. Then, the water continues to flow to the sides of each tube 33 from the second water passage 213. It should be noted that the wave-shaped heat dissipation fins 35 is connected between the tubes 33 and the heat is conducted to and dissipated from the wave-shaped heat dissipation fins 35 to the outside of the device when the heat-carrying water passes through the tubes 33.

Figure 10:
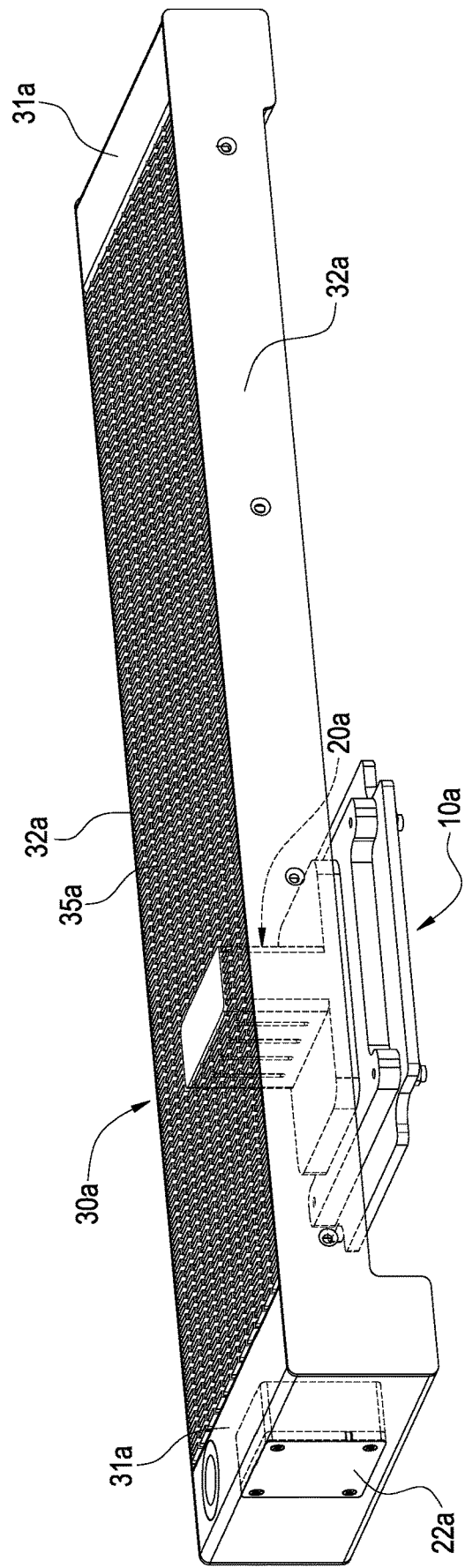
FIG. 10 is a schematic view of another embodiment of the assembly of the internal circulation water cooling heat dissipation device of this disclosure.
Figure 11:
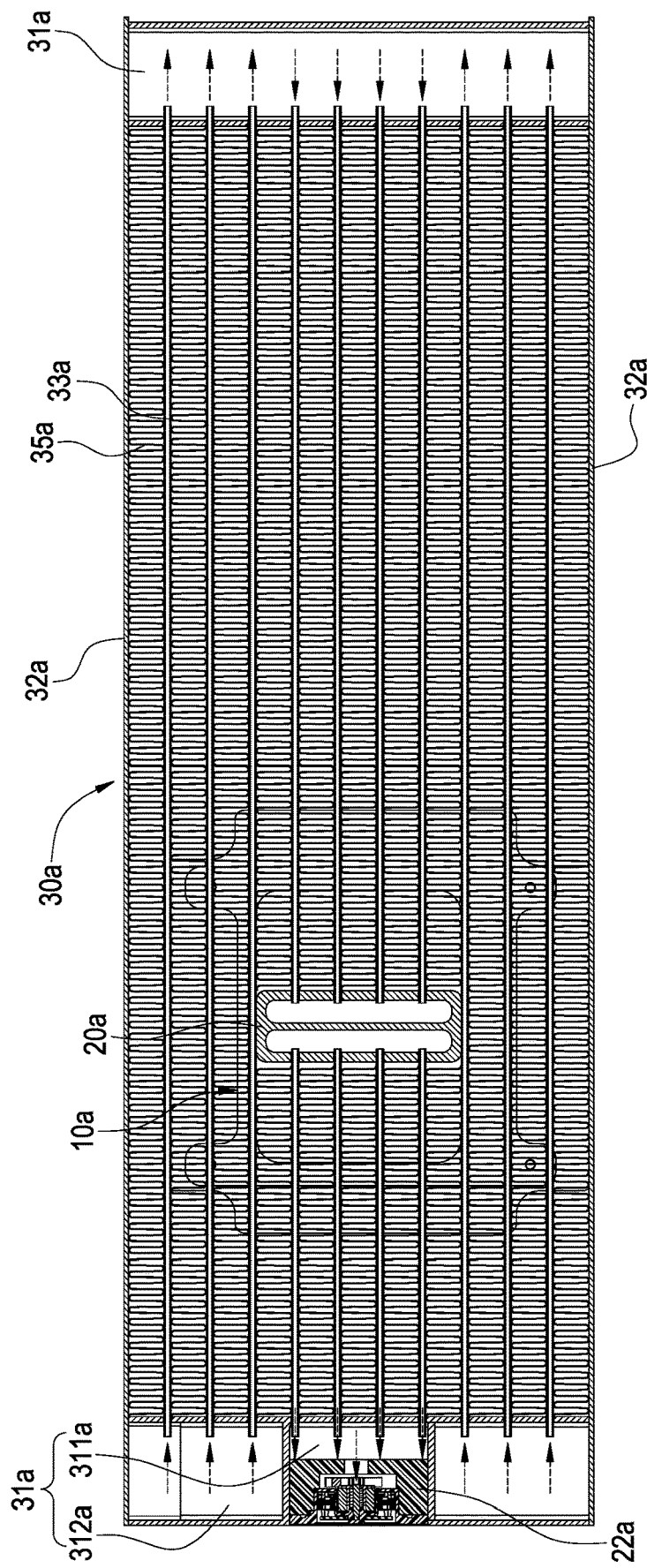
FIG. 11 is a cross sectional view of another embodiment of the combination of the delivering structure and the water-cooling radiator of this disclosure.

Please further refer to FIG. 10 to FIG. 13, which depict another embodiment of the internal circulation water cooling heat dissipation device. As shown in FIG. 10 and FIG. 11, this embodiment is substantially the same as the previous embodiment. The internal circulation water cooling heat dissipation device includes a water cooling head 10a, a delivering structure 20a, a water-cooling radiator 30a and a water pump 22a. The water-cooling radiator 30a includes a pair of water storage chambers 31a, a pair of frame plates 32a and a plurality of tubes 33a. The difference between this embodiment and the previous embodiment is the position of the water pump 22a.

In one embodiment of this disclosure, the water pump 22a is installed on one side edge of the water-cooling radiator 30a. Specifically, the water pump 22a is installed on one side edge of the water-cooling radiator 30a and located in one water storage chamber 31a of the pair of water storage chambers 31a. Additionally, the interior of one of the water storage chambers 31a is divided into a water inlet chamber 311a and a water outlet chamber 312a. In this embodiment, the number of the water outlet chambers 312a is multiple, and the water inlet chamber 311a is located between the multiple water outlet chambers 312a. Furthermore, the water pump 22a is installed in the water inlet chamber 311a.

Figure 12:
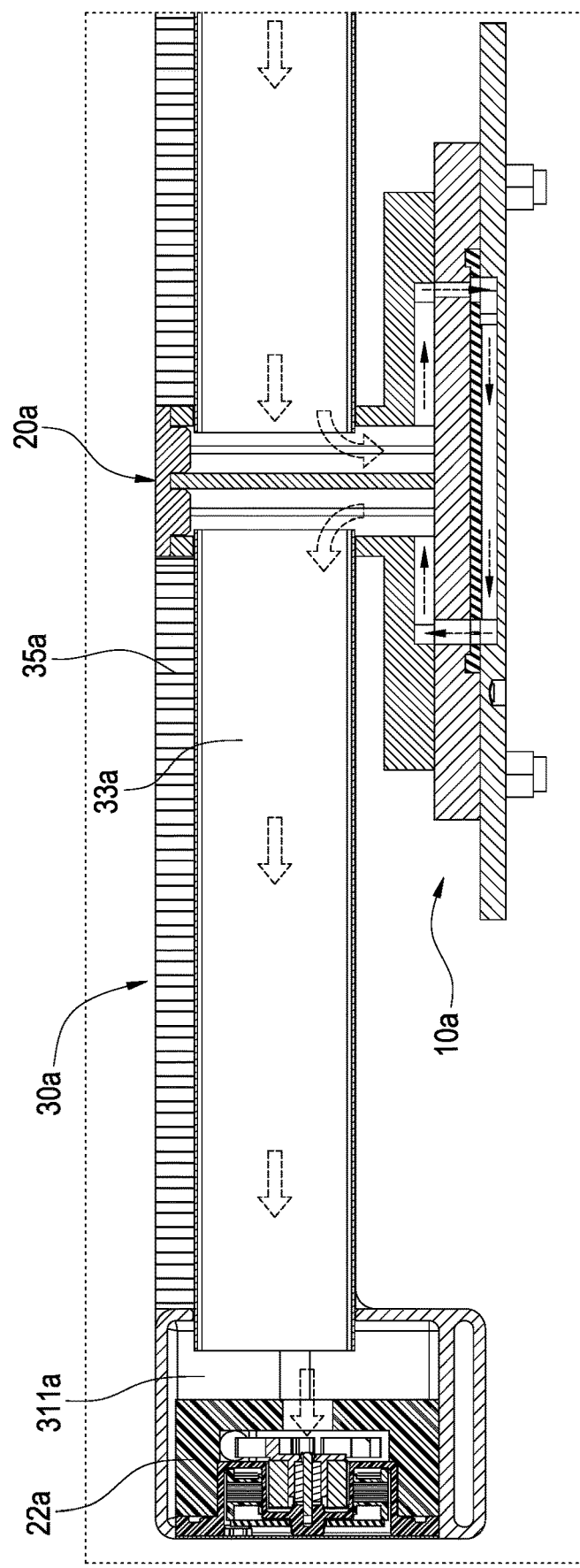
FIG. 12 is a schematic view of another embodiment of the operation of the internal circulation water cooling heat dissipation device of this disclosure.
Figure 13:
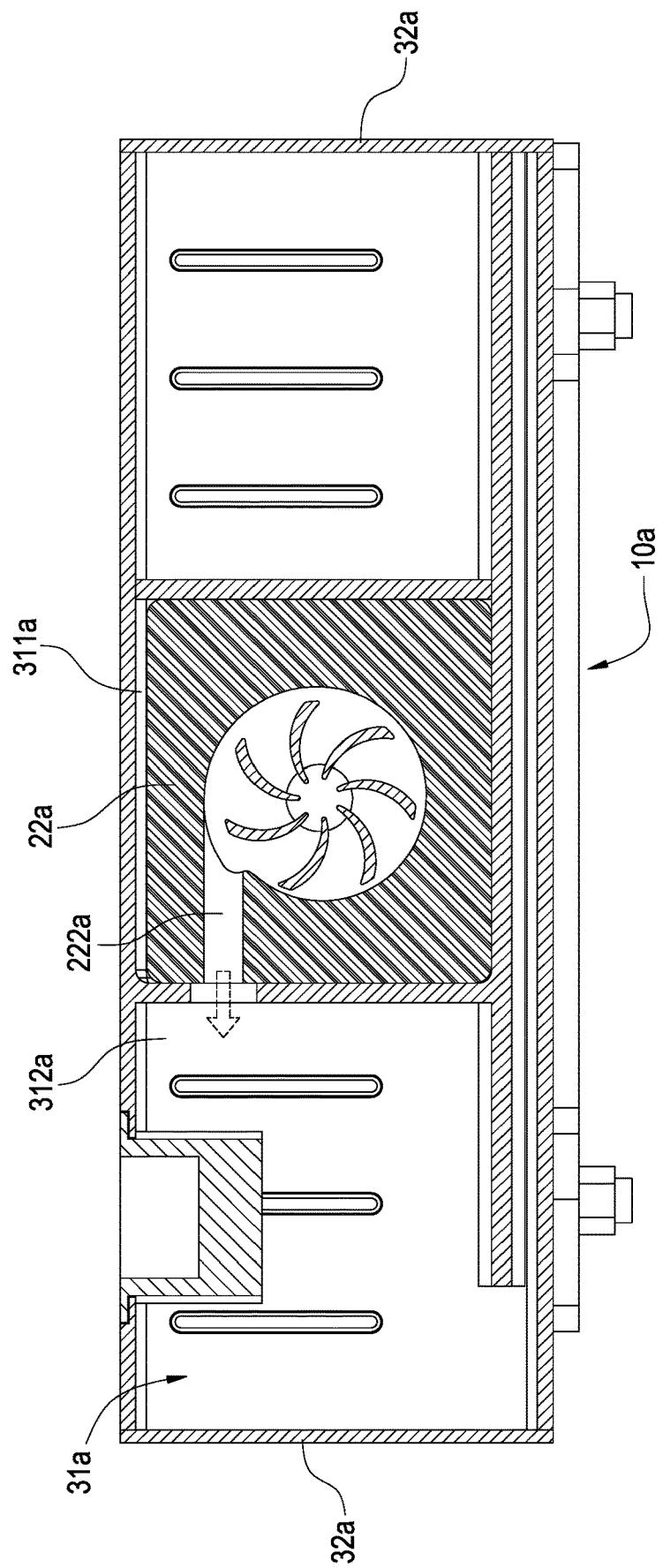
FIG. 13 is a cross sectional view of another side of another embodiment of assembly of the internal circulation water cooling heat dissipation device of this disclosure.

Please refer to FIG. 12 and FIG. 13, in this embodiment, when the water-cooling device is in use, the water flowing from the water cooling head 10a enters the tubes 33a through the delivering structure 20a. Subsequently, the water flows into the water storage chamber 31a through the tubes 33a. The water is sent out from the lateral hole 222a of the water pump 22a to enter the water outlet chamber 312 under the operation of the water pump 22a, and then the water flows into the tubes 33a. The heat is conducted to the wave-shaped heat dissipation fins 35a from the tubes 33a, and dissipated from the heat dissipation fins 35a to the outside of the device.

Figure 14:
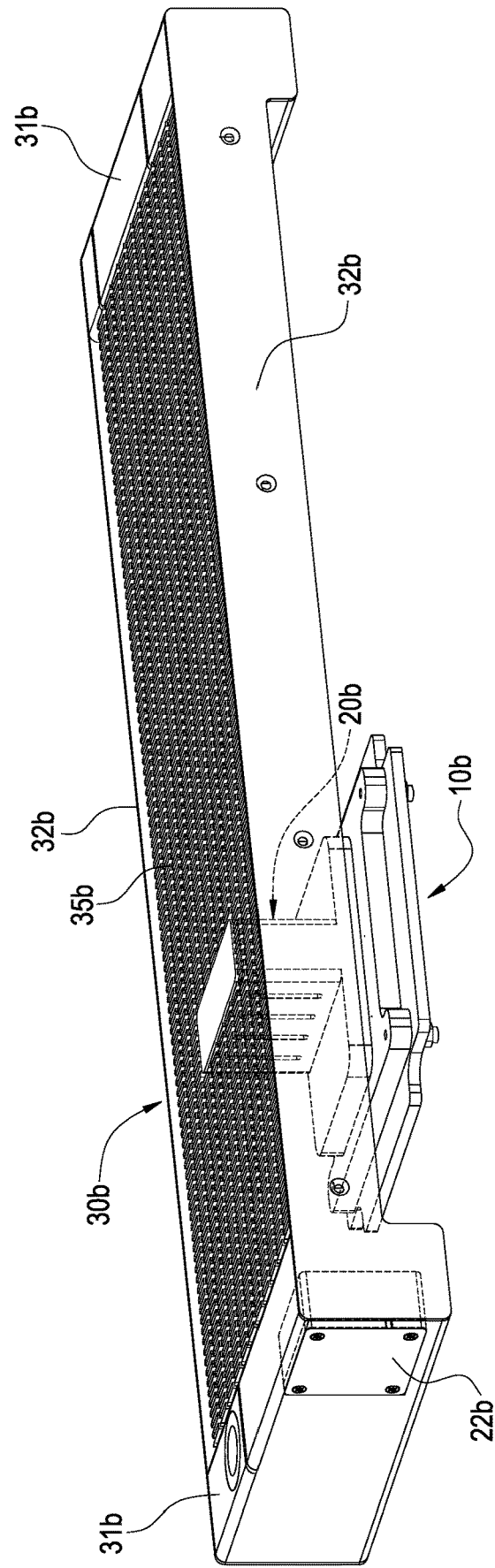
FIG. 14 is a schematic view of still another embodiment of the assembly of the internal circulation water cooling heat dissipation device of this disclosure.
Figure 15:
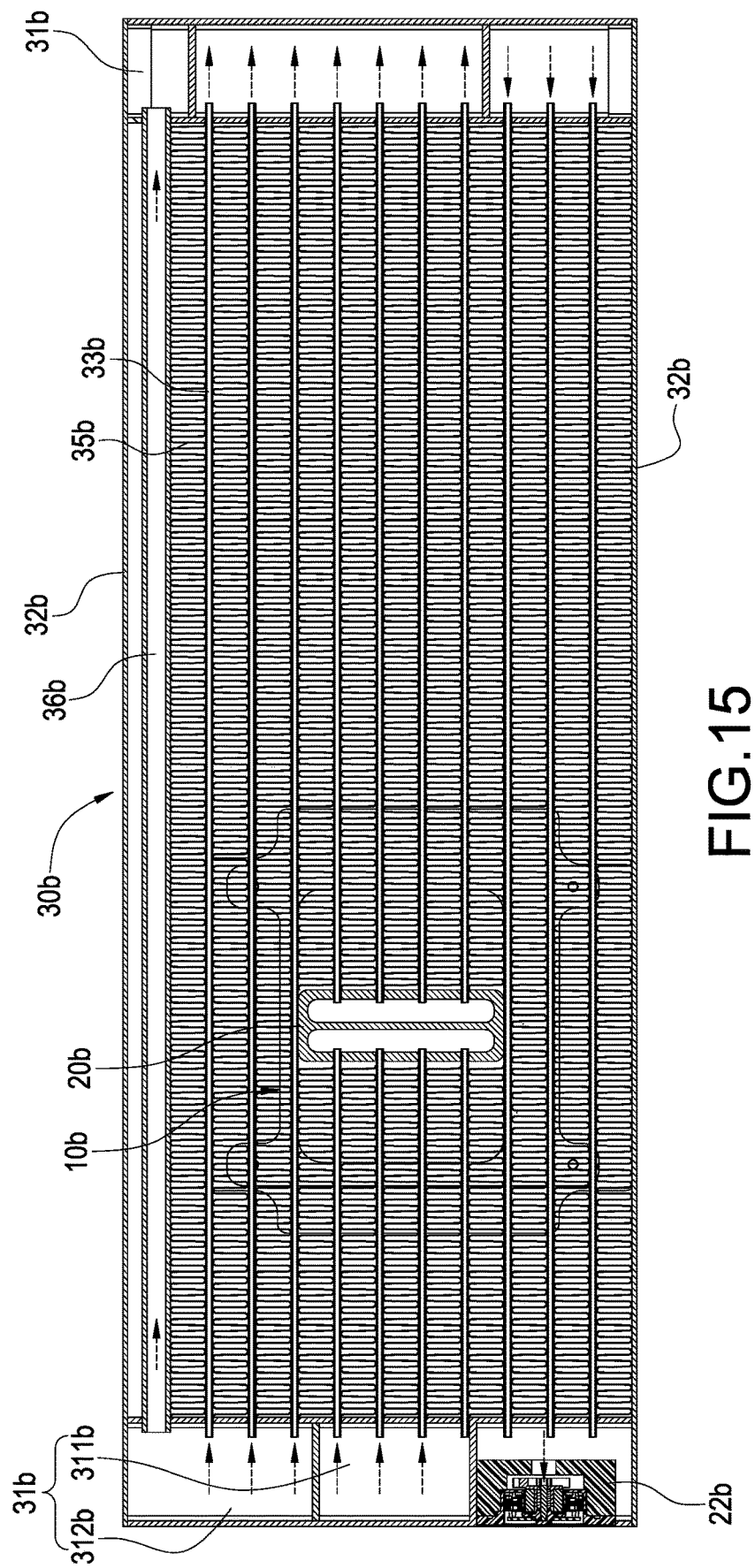
FIG. 15 is a cross sectional view of still another embodiment of the combination of the delivering structure and the water-cooling radiator of this disclosure.

Please further refer to FIG. 14 and FIG. 15, which depict still another embodiment of the internal circulation water cooling heat dissipation device. This embodiment is substantially the same as the previous embodiment. The internal circulation water cooling heat dissipation device includes a water cooling head 10b, a delivering structure 20b, a water-cooling radiator 30b and a water pump 22b. The water-cooling radiator 30b mainly includes a pair of water storage chambers 31b, a pair of frame plates 32b and a plurality of tubes 33b. The difference between this embodiment and the previous embodiment is the position of the water pump 22a.

In this embodiment, the water pump 22b is installed on one side edge of the water-cooling radiator 30b. Specifically, the water pump 22b is installed on one side edge of the water-cooling radiator 30b and located in one water storage chamber 31b of the pair of water storage chambers 31b. In addition, the interior of one of the water storage chambers 31b is divided into a water inlet chamber 311b and a water outlet chamber 312b. In this embodiment, the number of the water outlet chambers 312b is multiple, and multiple water outlet chambers 311b are arranged adjacently. The water inlet chamber 311b is located on one side of the water outlet chambers 312b, and the water pump 22b is installed in the water inlet chamber 311b.

It should be noted that, in this embodiment, the water-cooling radiator 30b further includes a water delivery pipe 36b. The water delivery pipe 36b is located on one side of the tubes 33b away from the water pump 22b to enhance the efficiency of the water outflow on the side of the tubes 33b.

Figure 16:
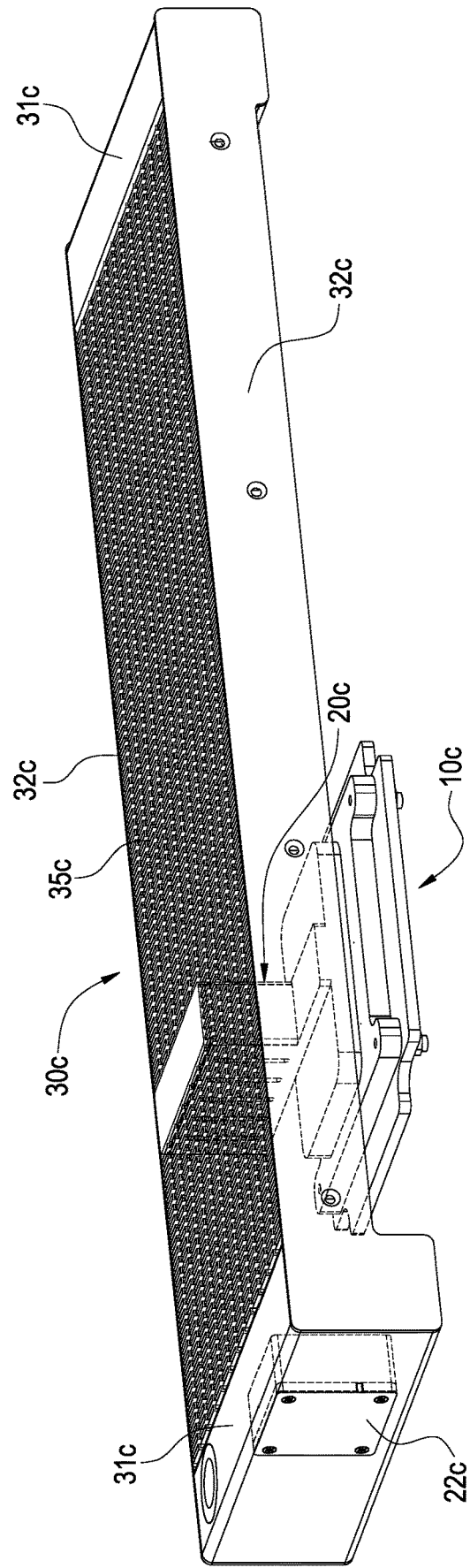
FIG. 16 is a schematic view of yet other embodiment of the assembly of the internal circulation water cooling heat dissipation device of this disclosure.
Figure 17:
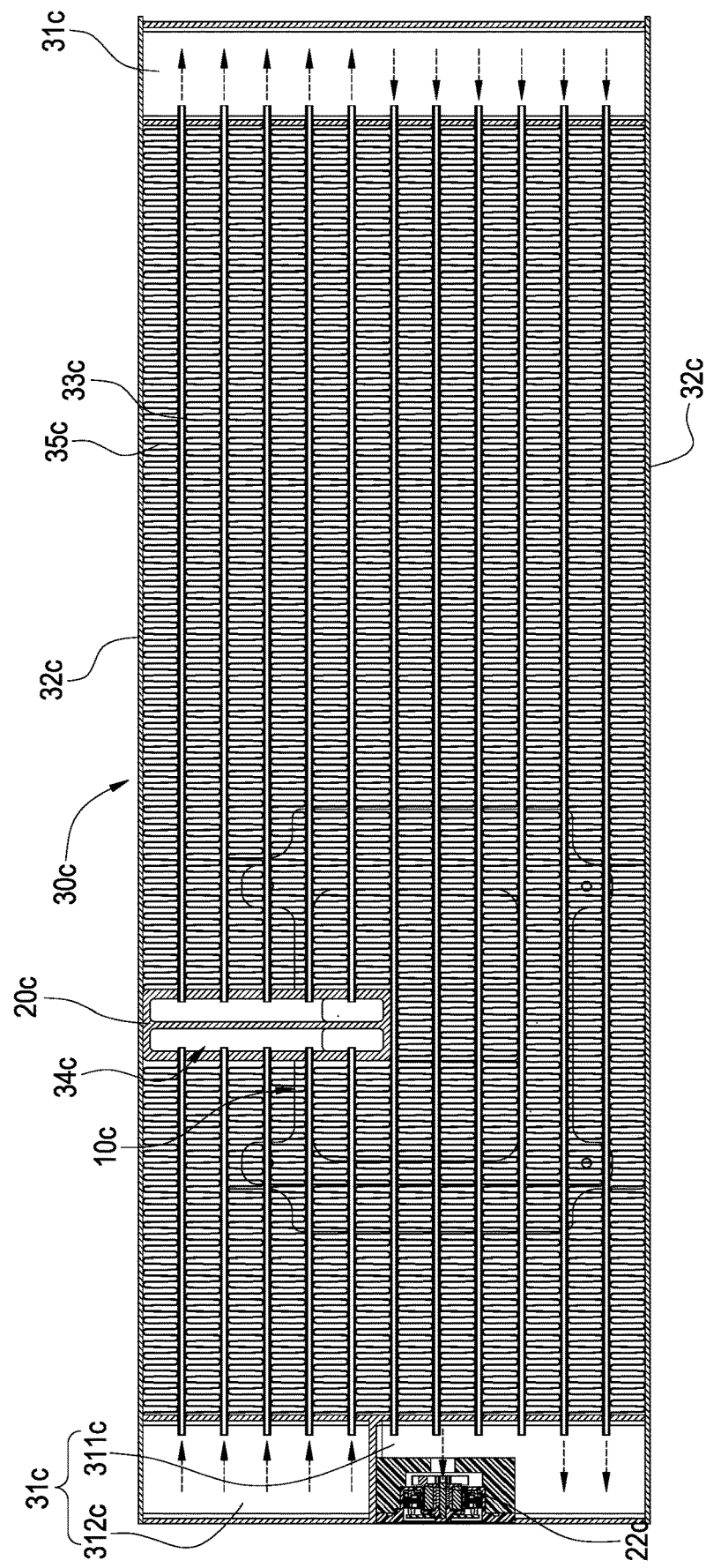
FIG. 17 is a cross sectional view of yet other embodiment of the combination of the delivering structure and the water-cooling radiator of this disclosure.
Figure 18:
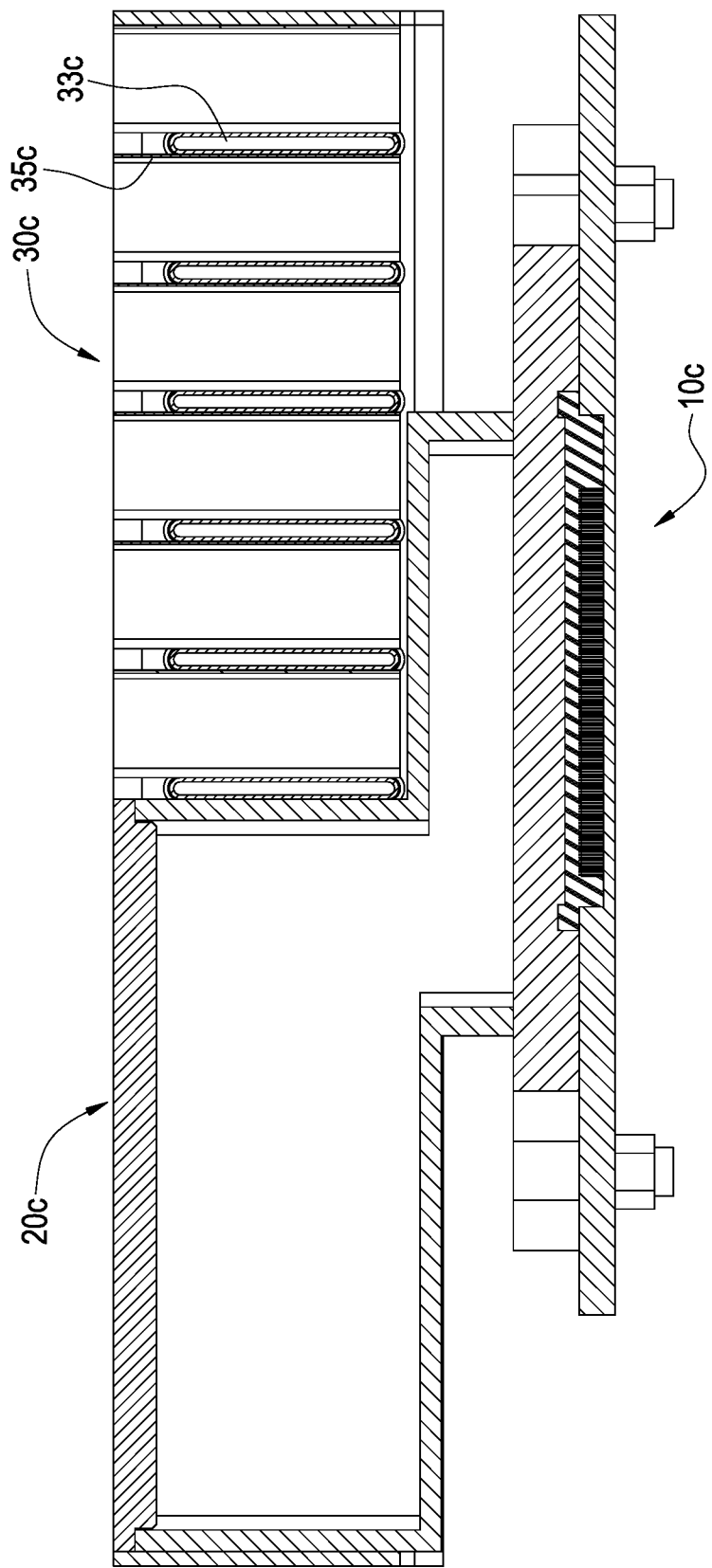
FIG. 18 is a schematic view of yet other embodiment of the operation of the internal circulation water cooling heat dissipation device of this disclosure.

Please further refer to FIG. 16 to FIG. 20, which depict yet other embodiment of the internal circulation water cooling heat dissipation device. As shown in FIG. 16 to FIG. 18, this embodiment is substantially the same as the previous embodiment. The internal circulation water cooling heat dissipation device includes a water cooling head 10c, a delivering structure 20c, a water-cooling radiator 30c and a water pump 22c. The water-cooling radiator 30c includes a pair of water storage chambers 31c, a pair of frame plates 32b and a plurality of tubes 33c. The difference between this embodiment and the previous embodiment is the positions of the delivering structure 20c and the water pump 22c.

In one embodiment of this disclosure, a window 34c is formed in the water-cooling radiator 30c and each of the tubes 33c is split by the window 34c. The delivering structure 20c inserts in the window 34c. The window 34c is located on the side of the water-cooling radiator 30c away from the water pump 22c.

Moreover, the water pump 22c is installed on one side edge of the water-cooling radiator 30c. Specifically, the water pump 22c is installed on one side edge of the water-cooling radiator 30c and located in one water storage chamber 31c of the pair of water storage chambers 31c. Furthermore, the interior of one of the water storage chambers 31c is divided into a water inlet chamber 311c and a water outlet chamber 312c. Additionally, the water pump 22c is installed in the water inlet chamber 311c.

Figure 19:
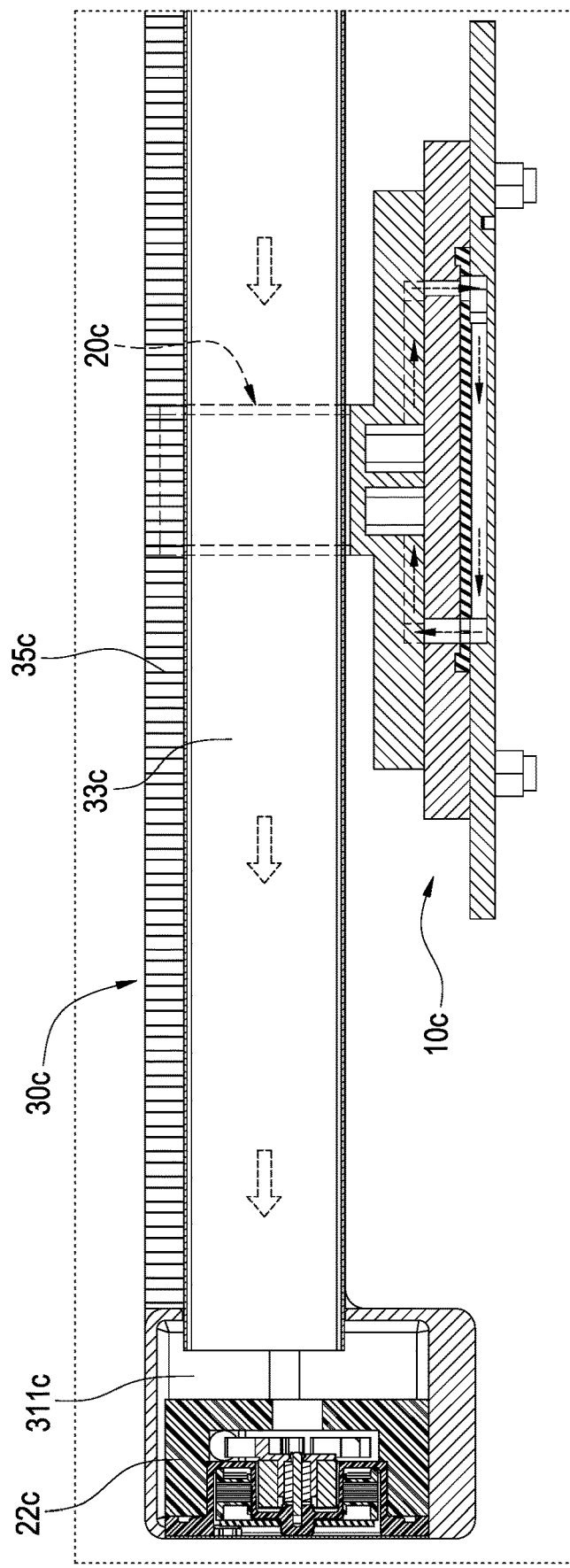
FIG. 19 is a cross sectional view of another side of yet other embodiment of the assembly of the internal circulation water cooling heat dissipation device of this disclosure.
Figure 20:
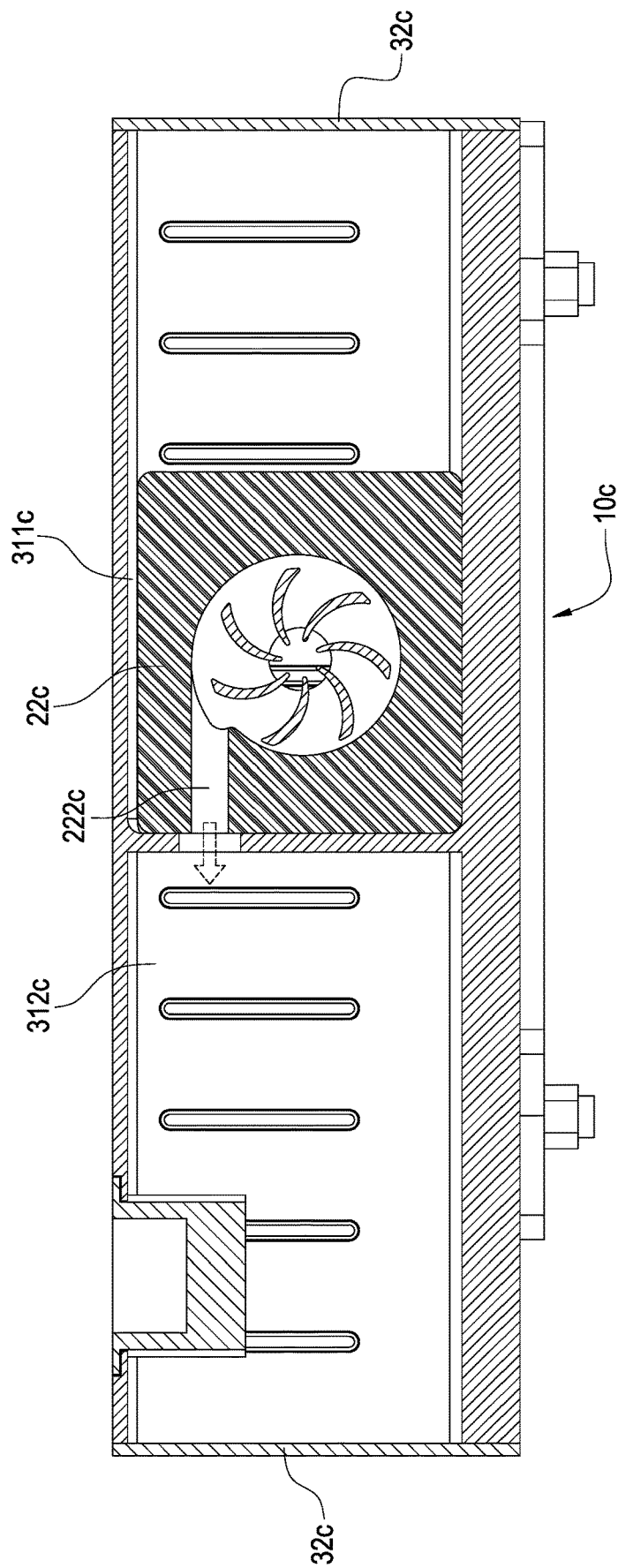
FIG. 20 is a schematic view of another side of yet other embodiment of the assembly of the internal circulation water cooling heat dissipation device of this disclosure.

As shown in FIG. 19 and FIG. 20, when the water-cooling device is in use, the water flowing from the water cooling head 10c enters the tubes 33c through the delivering structure 20c and then flows into the water storage chamber 31c through the tubes 33c. The water is sent out from the lateral hole 222c of the water pump 22c and flows into the water outlet chamber 312c under the operation of the water pump 22c. The heat is conducted to the wave-shaped heat dissipation fins 35c from the tubes 33c, and the heat is dissipated from the heat dissipation fins 35c to the outside of the device.

Figure 21:
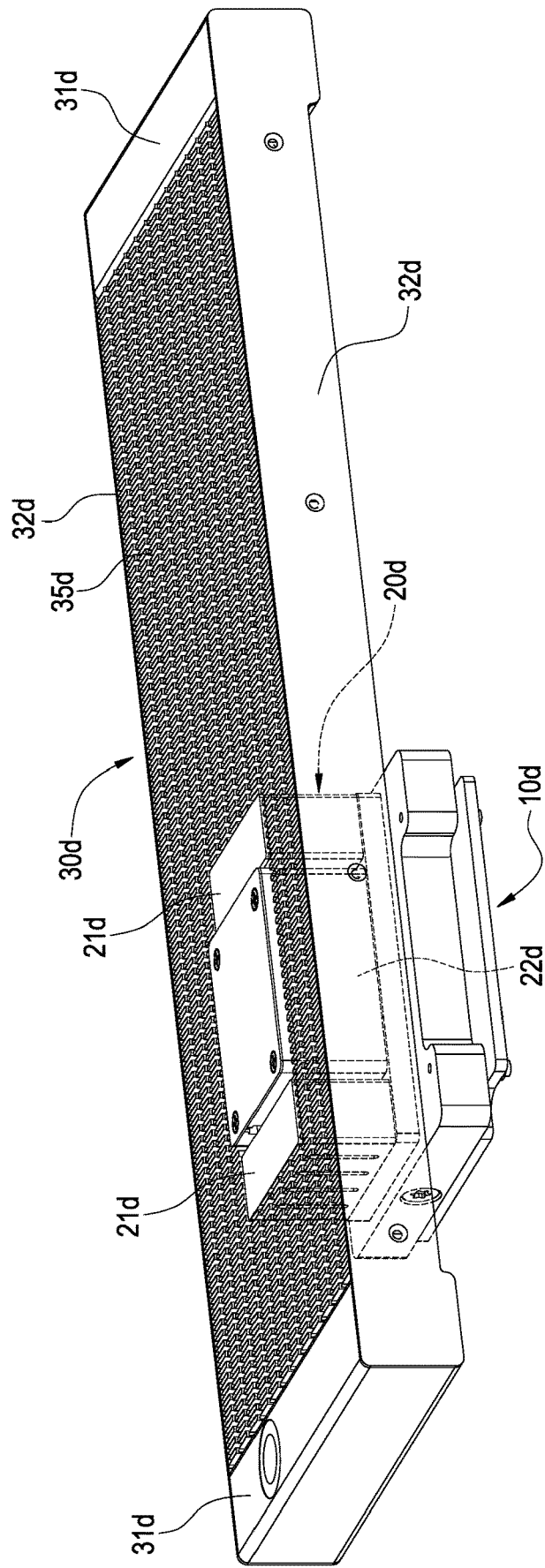
FIG. 21 is a schematic view of yet still other embodiment of the assembly of the internal circulation water cooling heat dissipation device of this disclosure.
Figure 22:
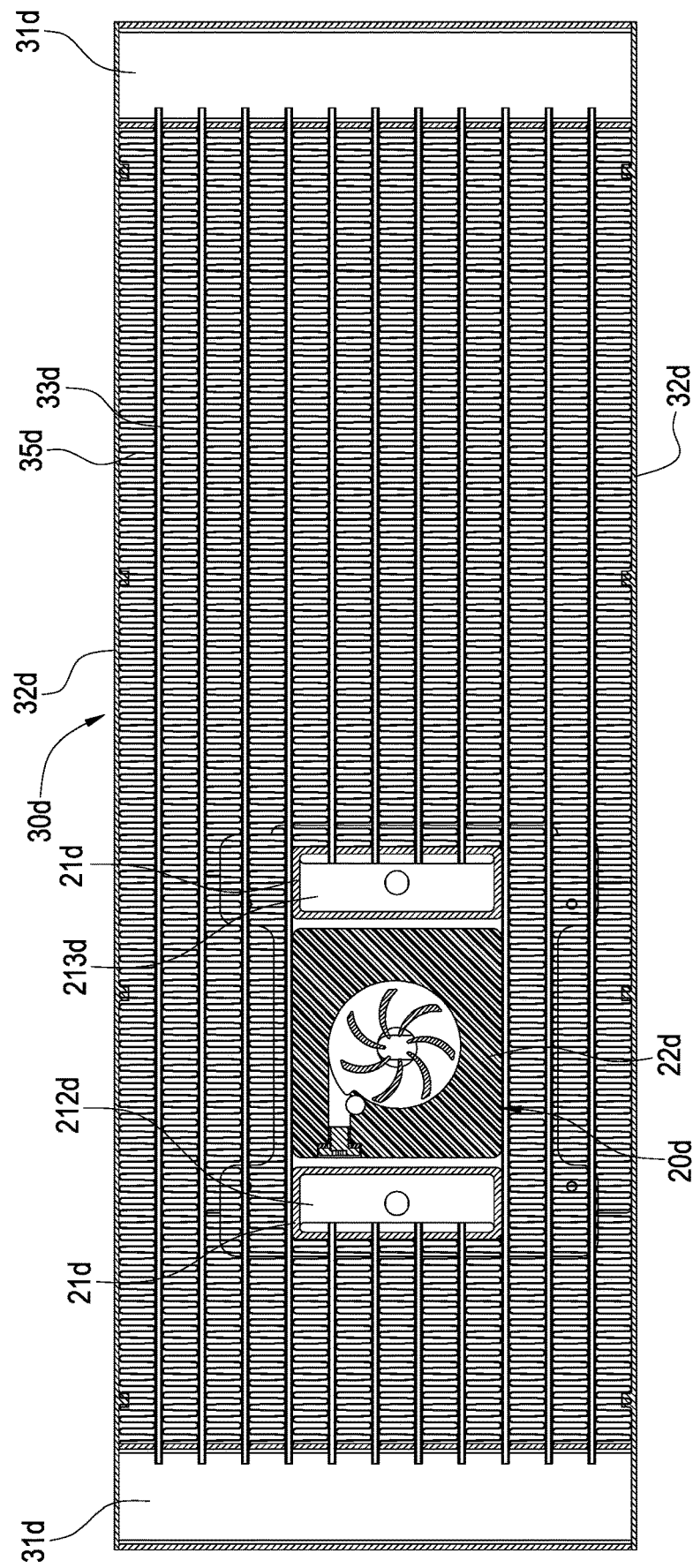
FIG. 22 is a cross sectional view of yet still other embodiment of the combination of the delivering structure and the water-cooling radiator of this disclosure.
Figure 23:
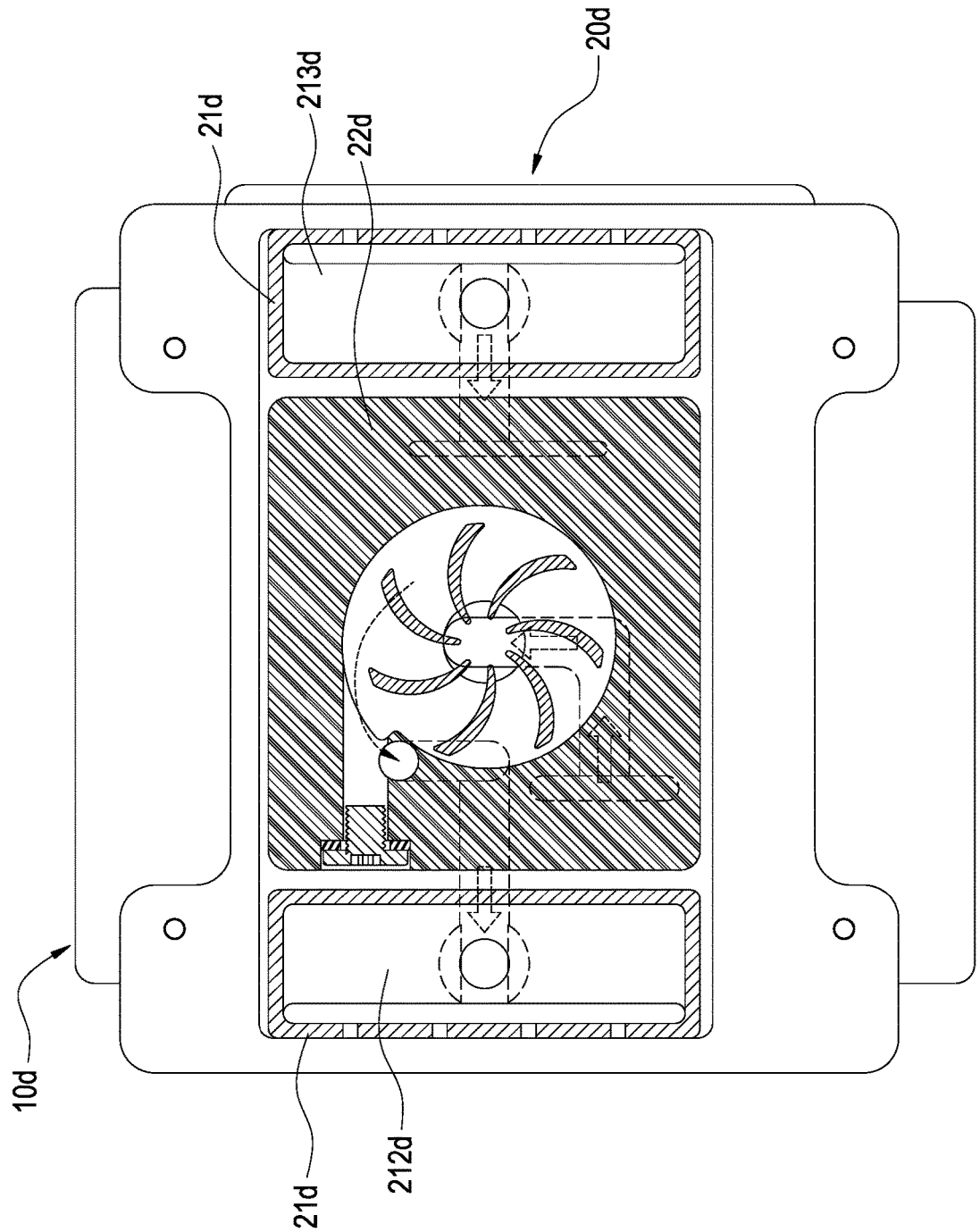
FIG. 23 is a cross sectional view of another side of yet still other embodiment of the combination of the delivering structure and the water-cooling radiator of this disclosure.

Please further refer to FIG. 21 to FIG. 24, which depict yet still other embodiment of the internal circulation water cooling heat dissipation device. As shown in FIG. 21 to FIG. 23, in this embodiment, the internal circulation water cooling heat dissipation device includes a water cooling head 10d, a delivering structure 20d, a water-cooling radiator 30d and a water pump 22d. The delivering structure 20d includes a water delivery column 21d, and the water delivery column 21d includes a first water passage 212d and a second water passage 213d. Additionally, the water-cooling radiator 30d includes a pair of water storage chambers 31d, a pair of frame plates 32d and a plurality of tubes 33d. The difference between this embodiment and the previous embodiment is the positions of the delivering structure 20d and the water pump 22d.

In this embodiment, the first water passage 212d and the second water passage 213d are arranged separately. The first water passage 212d and the second water passage 213d may be respectively a single water delivery column 21d. In addition, the water pump 22d is installed between the first water passage 212d and the second water passage 213d.

Figure 24:
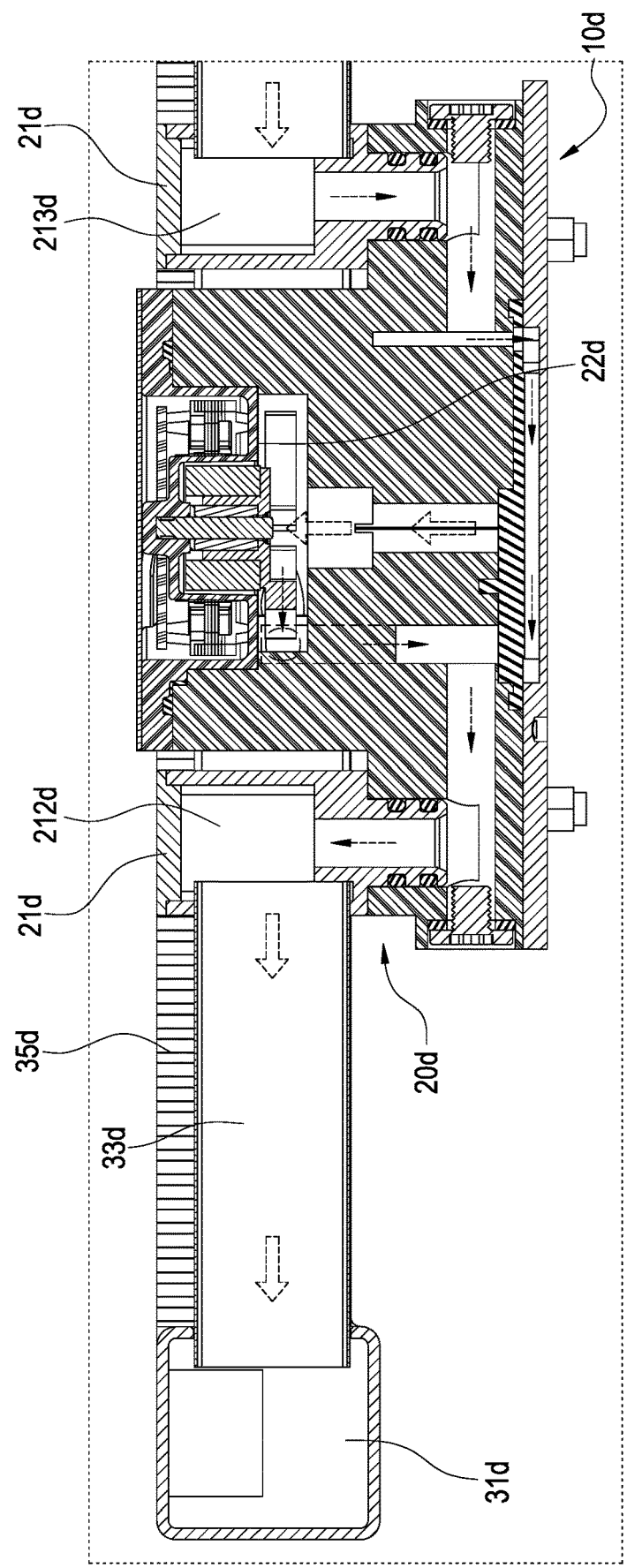
FIG. 24 is a schematic view of yet still other embodiment of the operation of the internal circulation water cooling heat dissipation device of this disclosure.

As shown in FIG. 24, when the water-cooling device is in use, the water flows into the water cooling head 10d from the first water passage 212d. The water flowing from the water cooling head 10d is sent out from the lateral hole 222d of the water pump 22d under the operation of the water pump 22d. Subsequently, the water enters the tubes 33d through the second water passage 213d of the delivering structure 20d and flows into the water storage chamber 31d through the tubes 33d. The heat is conducted to the wave-shaped heat dissipation fins 35d from the tubes 33d, and the heat is dissipated from the heat dissipation fins 35d to the outside of the device.

Although this disclosure has been described with reference to the embodiment thereof, it will be understood that the disclosure is not limited to the details thereof. Various substitutions and improvements have been suggested in the foregoing description, and others will occur to those of ordinary skill in the art. Therefore, all such substitutions and improvements are intended to be embraced within the scope of the disclosure as defined in the appended claims.

What is claimed is:

1. An internal circulation water cooling heat dissipation device, comprising:
   a water cooling head, comprising a chamber;
   a delivering structure, disposed on the water-cooling head and comprising a water delivery column, and the water delivery column comprising a first water passage and a second water passage communicating with the chamber respectively, wherein a plurality of first slot holes is disposed on the first water passage, and a plurality of second slot holes are disposed on the second water passage;
   a water-cooling radiator, comprising a pair of water storage chambers located on two sides of the water-cooling radiator, respectively, a plurality of tubes arranged spaced and parallel between the pair of water storage chambers, a window disposed in the water-cooling radiator and each tube being split by the window, and two nozzles disposed on each tube being split, the water delivery column inserting in the window, and each first slot hole welded to one nozzle of each tube, and each second slot hole welded to the other nozzle of each tube;
   wherein an interior of one of the water storage chambers is divided into a water inlet chamber and a water outlet chamber; and
   a water pump, installed in the water inlet chamber;
   wherein each tube being split includes a first tube connecting with the first water passage, and a second tube connecting with the second water passage;
   wherein water flows into the chamber from the second water passage and out to the first water passage then to the first tube, flows into the water pump from the first tube and out to tubes not being split, and flows into another water storage chamber and out to the second tube then to the second water passage.

2. The internal circulation water cooling heat dissipation device according to claim 1, wherein the water cooling radiator further comprises a pair of frame plates, and each frame plate is connected to two sides of each water storage chamber respectively and encloses the tubes therein.

3. The internal circulation water cooling heat dissipation device according to claim 1, wherein a number of the water outlet chamber is multiple, and the water inlet chamber is located between the multiple water outlet chambers.

4. The internal circulation water cooling heat dissipation device according to claim 1, wherein the window is located in a middle area of the water-cooling radiator.

5. The internal circulation water cooling heat dissipation device according to claim 1, wherein the first water passage and the second water passage are configured by the water delivery column in one-piece form, and an interior of the water delivery column is separated into the first water passage and the second water passage by a partition.

* * * * *